(12) United States Patent
Maulini et al.

(10) Patent No.: US 7,944,959 B2
(45) Date of Patent: May 17, 2011

(54) QUANTUM CASCADE LASER AMPLIFIER WITH AN ANTI-REFLECTION COATING INCLUDING A LAYER OF YTTRIUM FLUORIDE

(75) Inventors: Richard Maulini, Travers (CH); Stephane Blaser, Fontaine (CH); Jerome Faist, Zurich (CH)

(73) Assignee: Alpes Lasers SA, Neuchatel (CH)

( * ) Notice: Subject to any disclaimer, the term of this patent is extended or adjusted under 35 U.S.C. 154(b) by 113 days.

(21) Appl. No.: 12/518,565

(22) PCT Filed: Nov. 20, 2007

(86) PCT No.: PCT/EP2007/062549
§ 371 (c)(1), (2), (4) Date: Jun. 10, 2009

(87) PCT Pub. No.: WO2008/071518
PCT Pub. Date: Jun. 19, 2008

(65) Prior Publication Data
US 2010/0046568 A1 Feb. 25, 2010

(30) Foreign Application Priority Data
Dec. 11, 2006 (EP) .................................... 06125845

(51) Int. Cl.
*H01S 3/30* (2006.01)
*H01S 5/00* (2006.01)
(52) U.S. Cl. ........................ 372/49.01; 372/4; 372/50.22
(58) Field of Classification Search ........... 372/4, 49.01, 372/50.22
See application file for complete search history.

(56) References Cited

U.S. PATENT DOCUMENTS
2004/0042520 A1 3/2004 Shigihara et al.
2004/0161009 A1 8/2004 Edamura et al.

FOREIGN PATENT DOCUMENTS
EP 0 845 819 6/1998
EP 1 195 865 4/2002
JP 2000-58884 2/2000

OTHER PUBLICATIONS

Richard Maulini et al., "Continuous-wave operation of a broadly tunable thermoelectrically cooled external cavity quantum-cascade laser", Optics Letters, OSA, Optical Society of America, Washington, DC, US, vol. 30, No. 19, Oct. 1, 2005, ISSN: 01495-9592, XP001235357, pp. 258, left-hand column—p. 2584 left-hand column, pp. 2584-2596.
G. P. Luo et al., "Grating-tuned external-cavity quantum-cascade semiconductor lasers", Applied Physics Letters, AIP American Institute of Physics, Melville, NY, USA, vol. 78, No. 19, May 7, 2001, ISSN: 0003-6951, XP012027922, pp. 2834-2836.
A. V. Vanyakin, et al., "Interference optics for laser and parametric oscillators emitting in the middle-IR range", Quantum Electronics, vol. 27, No. 2, Feb. 1997, XP009083667, pp. 137-139.
Li Da-Qui et al., "Design and Fabrication of 6.4-15um Broadband Antireflection Coatings", Journal of Infrared and Millimeter Waves, vol. 25, No. 2, Apr. 2006, XP009083554, pp. 135-137.
International Search Report dated Apr. 11, 2008, from corresponding PCT application.

*Primary Examiner* — Armando Rodriguez
(74) *Attorney, Agent, or Firm* — Young & Thompson

(57) ABSTRACT

A quantum cascade laser amplifier (12) having an active zone (20) includes a stack of raw layers of semi-conductor materials formed in an epitaxial manner on a substrate layer (16) of indium. phosphide (InP) or gallium arsenide (GaAs) bearing the active zone (20), and a vertical anti-reflection coating (34) that covers an outlet face (28) of the laser radiation made of materials having given refraction indices and a predetermined thickness so that the entire laser radiation can flow through the outlet face. The anti-reflection coating (34) includes a first layer (36) having a first predetermined retraction index ($n_1$) lower than the predetermined refraction index ($n_D$), and at least a second layer (38) having a second refraction index ($n_2$) higher than the predetermined refraction index ($n_D$), wherein the first layer (36) of the anti-reflection coating (34) is made of yttrium fluoride ($YF_3$).

21 Claims, 2 Drawing Sheets

QUANTUM CASCADE LASER AMPLIFIER WITH AN ANTI-REFLECTION COATING INCLUDING A LAYER OF YTTRIUM FLUORIDE

TECHNICAL FIELD

The invention relates to a quantum cascade laser amplifier which includes an output face on which an anti-reflection coating is applied.

The invention more particularly relates to a quantum cascade laser amplifier which is capable of emitting infrared laser radiation, and which includes:
- an active area which is formed by a vertical stack of horizontal layers of semiconducting materials grown epitaxially on an indium phosphide substrate (InP) or a gallium arsenide (GaAs) substrate;
- an anti-reflection vertical coating which covers a laser radiation output end vertical face and which has a determined refractive index so as to let the totality of the laser radiation pass through the output face, the anti-reflection coating including:
- at least one first layer having a first refractive index smaller than the determined refractive index;
- and at least one second layer having a second refractive index larger than the determined refractive index.

STATE OF THE ART

Lasers of the quantum cascade type are already known from the state of the art. An exemplary quantum cascade laser is notably disclosed in detail in document EP-A1-1 195 865.

This type of laser generally includes a semiconductor amplifier such as a chip or a laser diode which is associated with a so-called Fabry-Perot resonant cavity.

When an electric current is applied to it, the laser amplifier emits laser radiation. The resonant cavity includes a first means for at least partly reflecting the laser radiation towards a second reflection means by passing through the laser amplifier. The second reflection means reflects the laser radiation again towards the first reflection means via the amplifier. The laser radiation thus performs successive round trips in the laser amplifier, which causes amplification of the laser radiation.

Making a Fabry-Perot cavity internal to the laser is known. The reflection means are then formed by cleaved opposite vertical faces of the laser amplifier, at least one of which forms the output face of the laser radiation.

Making an external Fabry-Pérot cavity is also known. The first reflection means, such as a semireflecting mirror, is then laid out outside the laser on the trajectory of the laser radiation. With this mirror, the laser radiation emitted by the output face may again be reflected towards the output face of the laser. The reflected radiation thus enters the laser amplifier, and then is reflected by the second reflection means which may be formed by a cleaved reflecting face opposite to the output face. At each passage through the laser amplifier, the laser radiation is thus amplified.

Such a quantum cascade laser for example emits multimode laser radiation, one mode corresponding to a wavelength of light making up the laser radiation. The light wavelength of each mode is comprised in the near and mean infrared range, i.e. between 3 and 18 μm.

The use of a dispersive element, for example a diffraction grating, is known in a laser with an external cavity in order to spectrally filter the radiation reflected in the laser amplifier in order to produce globally single-mode laser radiation.

In order to increase the tuning range of such a laser and to facilitate continuous tuning, it is preferable that the output face of the laser should entirely let through the laser radiation without reflecting part of it towards the interior of the laser amplifier, which would perturb the tuning. Indeed, the laser amplifier would then form a parasitic internal resonant cavity comprised in the external cavity, causing the appearance of parasitic modes.

Now, when the output face is not treated, the difference between the refractive index $n_L$ of the amplifier medium forming the laser amplifier, which for example is comprised between 3.15 and 3.22, and the refractive index of air which is equal to 1, causes reflection of one portion of the incident laser radiation, the reflectivity of the output face is then about 27%, the reflectivity being calculated according to the formula $$(n_L-1)^2/(n_L+1)^2.$$

In order to solve this problem, it is known how to apply on the output face of the laser a coating of antireflective material, the refractive index of which is close to a determined ideal refractive index, for example here 1.8. This ideal refractive index is determined by calculating the reflectivity at an interface between two materials, here the air with refractive index $n_A=1$ and the substrate of refractive index $n_L$ and one obtains:

$$n_D=\sqrt{n_L}.$$

It is thus known how to apply an alumina ($Al_2O_3$) coating on the output face of the laser. However such a coating does not let through the totality of the infrared laser radiation because its refractive index is too far from the determined ideal refractive index. Thus, such an anti-reflection coating is suitable for wavelengths comprised in the near infrared, i.e. between 1 and 2 μm, but not for wavelengths comprised in the mean infrared, i.e. between 3 and 18 μm.

Such coatings are notably disclosed in document: Applied Physics Letters, Volume 78, p. 2834, dating from the year 2001, entitled "Grating-tuned external-cavity quantum-cascade semiconductors lasers" (G. P. Luo et al), as well as in document: Optics Letters, Volume 30, p. 2584, dating from the year 2005, and entitled "Continuous-wave operation of a broadly tunable thermoelectrically cooled external cavity quantum-cascade laser" (R. Maulini et al.).

Coatings made in other materials are also known, however these materials have the drawback of not properly adhering to the layers of materials forming the amplifier.

DISCLOSURE OF THE INVENTION

The present invention is therefore aimed at solving these problems by proposing a laser of the type described earlier, characterized in that the first layer of the anti-reflection coating is made in yttrium fluoride ($YF_3$).

According to other characteristics of the invention:
- the first layer of the anti-reflection coating is interposed between the output face of the laser amplifier and the second layer;
- the second layer is made in zinc selenide (ZnSe);
- the second layer is made is zinc sulfide (ZnS);
- the second layer is made in niobium oxide ($Nb_2O_5$);
- the second layer is made in silicon nitride ($Si_3N_4$);
- the laser amplifier emits multimode laser radiation in the near and/or mean infrared, the wavelengths of which are comprised between 3 and 18 μm;
- the thicknesses of the first and second layers of the anti-reflection coating are determined according to the wavelengths of the laser radiation.

SHORT DESCRIPTION OF THE DRAWINGS

Other features and advantages will become apparent upon reading the detailed description which follows, for the understanding of which reference will be made to the appended drawings wherein.

EMBODIMENT(S) OF THE INVENTION

Figure 1:
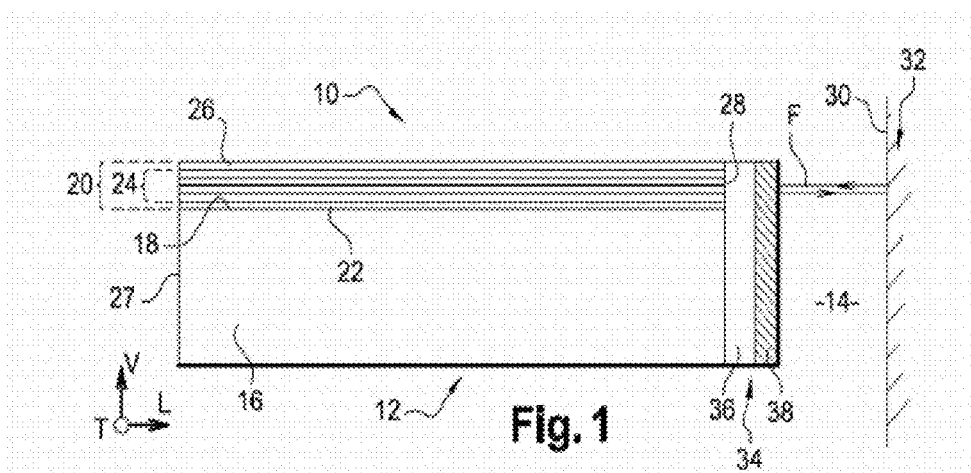
FIG. 1 is a sectional view which schematically illustrates a quantum cascade laser including a laser amplifier equipped with an anti-reflection coating made according to the teachings of the invention.

For the following description and for the claims, a longitudinal, vertical and transverse orientation will be adopted in a non-limiting way, indicated by the three-dimensional reference axis "L,V,T" of FIG. 1.

Subsequently, identical, analog or similar elements will be designated by the same reference numbers.

A quantum cascade laser 10 is illustrated in FIG. 1, which includes a laser amplifier 12 which is laid out in an external resonance cavity 14.

The laser amplifier 12 is shown here as a block, an array, a diode or a horizontal chip which is made with a stack of different layers of semiconducting materials.

In a known way, the laser amplifier 12 includes a lower horizontal substrate layer 16. On an upper face 18 of this substrate 16 is laid out an active area 20 which is formed by a vertical stack of horizontal layers of semiconducting materials.

The substrate 16 is capable of fulfilling an electrode function.

The active area 20 more particularly includes from bottom to top with reference to FIG. 1, a first lower optical confinement layer 22, a gain region 24 and a second upper optical confinement layer 26.

The gain region 24 is formed by a plurality of layers successively forming quantum wells and quantum barriers. The gain region 24 also includes injection barriers. For a more detailed description of such an active area 20 and of its composition, reference may be made to the aforementioned document EP-A1-1 195 865.

When the gain region 24 is powered with a suitable electric current via the substrate 16 and optical confinement layers 22, 26, laser radiation is generated in the gain region 24.

The optical confinement layers 22, 26 form a horizontal wave guide which is intended to guide the propagation of the laser radiation in the gain region 24 along a longitudinal direction.

All the layers of the amplifier 12 have a monocrystalline structure with the same lattice cell in the horizontal plane so that the laser amplifier 12 does not disintegrate.

The substrate 16 is made on the basis of indium, and more particularly in monocrystalline indium phosphide (InP). The substrate 16 is optionally doped in order to improve its electric conduction properties.

According to a non-illustrated alternative of the invention, the substrate 16 is made in a monocrystalline alloy of gallium arsenide (GaAs).

The different layers of the active area 20 are also made in monocrystalline semiconducting materials grown epitaxially on the substrate.

With such a composition, it is possible to define a crystalline structure with the same lattice cell in the horizontal plane and identical with that of the substrate 16 in InP. Thus, the laser amplifier 12 has a homogenous crystalline structure so that the different layers do not disintegrate.

In a known way, certain layers may be doped, for example with silicon (Si).

The laser amplifier 12 is longitudinally delimited by a rear end transverse vertical face 27 and by a front end transverse vertical face 28. Both front 28 and rear 27 faces are parallel. These faces 27, 28 are made by cleaving the crystal material forming the laser amplifier 12.

The front face 28 forms an output face for the laser radiation produced in the gain region 24 and the rear face 27 forms a face for reflecting the laser radiation, which is intended to reflect the laser radiation towards the interior of the gain region 24, as indicated by the arrows "F" of FIG. 1.

A semireflecting transverse vertical face 30 of an external mirror 32 is laid out facing and in front of the output face 28 of the laser amplifier 12. The semireflecting face 30 of the external mirror 32 is capable of reflecting at least one portion of the laser radiation exiting through the output face 28 of the laser amplifier 12.

The space which is longitudinally comprised between the semireflecting face 30 of the external mirror 32 and the rear reflection face 27 of the laser amplifier 12 forms the external resonance cavity 14 of the laser amplifier 12.

Such a laser is capable of emitting multimode laser radiation at wavelengths comprised between 3 and 18 μm in the near and mean infrared.

For the following description, the wave number of a laser radiation mode is defined as the reciprocal of its wavelength. Thus the wave numbers of mean infrared are comprised between 550 and 3,333 cm$^{-1}$.

When the output face 28 of the laser amplifier 12 is not treated, the difference between the refractive index "$n_L$" of the laser amplifier 12, which is comprised between 3.15 and 3.22 for the composition given as an example, and the refractive index of ambient air "$n_A$", which is globally equal to 1, causes reflection of a portion of the incident laser radiation, for example the reflectivity is about 27%.

The invention proposes the application on the output face 28 on the laser amplifier 12 of a particularly performing anti-reflection transverse vertical coating 34 capable of letting through a wide range of near and mean infrared laser radiation. The anti-reflection coating 34 has a refractive index which is close to an ideal refractive index "$n_D$" determined so as to let through the totality of the laser radiation. The determined ideal refractive index "$n_D$" is for example equal to 1.8 for the laser amplifier 12 given as an example.

According to the teachings of the invention, the anti-reflection coating 34 is formed by a first transverse vertical layer 36 having a first refractive index "$n_1$" which is smaller than the determined ideal refractive index "$n_D$", and a second transverse vertical layer 38 having a second refractive index "$n_2$" which is larger than the determined ideal refractive index "$n_D$".

The first layer 36 is interposed between the output face 28 and the second layer 38. Thus, the first layer 36 is directly laid out in contact with the output face 28 of the laser amplifier 12.

The first layer 36 of the anti-reflection coating 34 is made in yttrium fluoride ($YF_3$). The first layer 36 thus has a refractive index "$n_1$" which is smaller than the determined ideal refractive index "$n_D$". Further, the first layer 36 of the anti-reflection coating 34 made in this way perfectly adheres to the output face 28 of the laser amplifier 12.

The second layer 38 of the anti-reflection coating 34 is made in zinc selenide (ZnSe). The second layer 38 thus has a refractive index "$n_2$" which is larger than the determined ideal refractive index "$n_D$". The thereby made second layer 38 perfectly adheres to the first layer 36.

The refractive index "$n_1$, $n_2$" of each of the layers 36, 38 of the anti-reflection coating 34 depends on the wavelength of the relevant laser radiation. The thickness of the layers in order to obtain zero reflectivity is determined according to the wavelength of the relevant laser radiation. The calculation of the thicknesses adapted to the wave numbers of the laser radiation applies a known reflectivity calculation which for example is disclosed in the book entitle "Optoelectronique" (Optoelectronics) (E. Rosencher, B. Vinter), edited by Masson, Paris, 1998 edition, Chapter 9.

Figure 2:
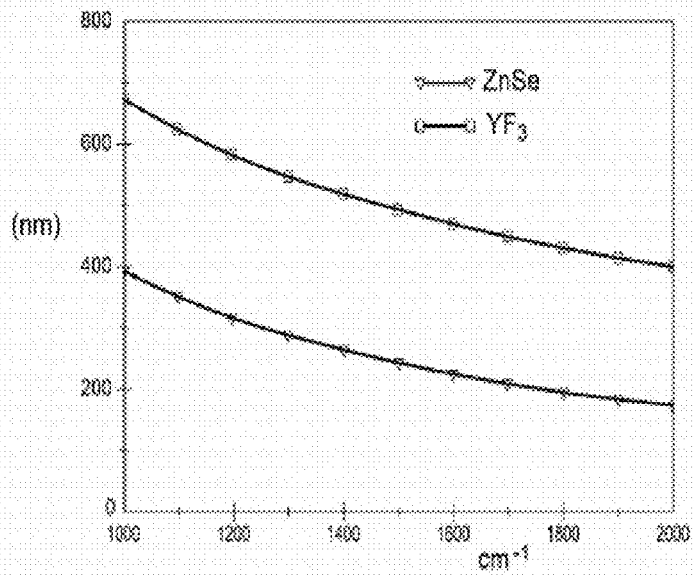
FIG. 2 is a graph which includes curves illustrating the thickness of the layers forming the anti-reflection coating made according to the teachings of the invention, versus the wave number, of the laser.

The thickness in nanometers of the first 36 and second 38 layers to be deposited on the output face 28 in order to obtain an anti-reflection coating 34 with zero reflectivity for different wave numbers in $cm^{-1}$, is indicated in the following "Table 1" corresponding to FIG. 2:

TABLE 1

| Wave number ($cm^{-1}$) | Thickness of the first $YF_3$ layer 36 (nm) | Thickness of the second ZnSe layer 38 (nm) |
| --- | --- | --- |
| 1,000 | 674 | 391 |
| 1,100 | 624 | 348 |
| 1,200 | 583 | 313 |
| 1,300 | 547 | 284 |
| 1,400 | 517 | 258 |
| 1,500 | 490 | 237 |
| 1,600 | 467 | 218 |
| 1,700 | 445 | 201 |
| 1,800 | 426 | 187 |
| 1,900 | 408 | 175 |
| 2,000 | 391 | 164 |

It is thus noted that the thereby made anti-reflection coating 34 is totally transparent to laser radiation, the modes of which have a wave number comprised in the mean infrared.

According to a non-illustrated alternative of the invention, the second layer 38 is made in zinc sulfide (ZnS). This material actually has refractive and adherence properties analogous to those of zinc selenide.

Figure 3:
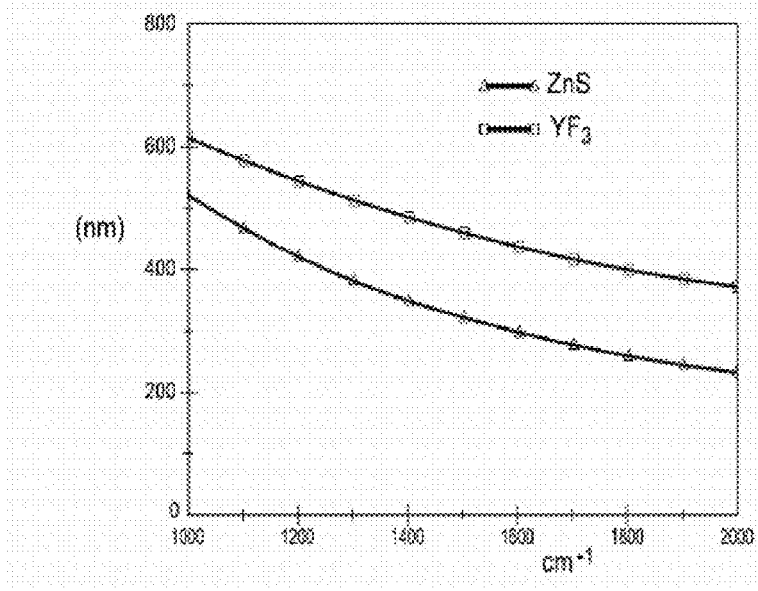
FIG. 3 is a graph which includes curves illustrating the thickness of the layers forming the anti-reflection coating made according to a second embodiment of the invention versus the wave number, of the laser.
Figure 4:
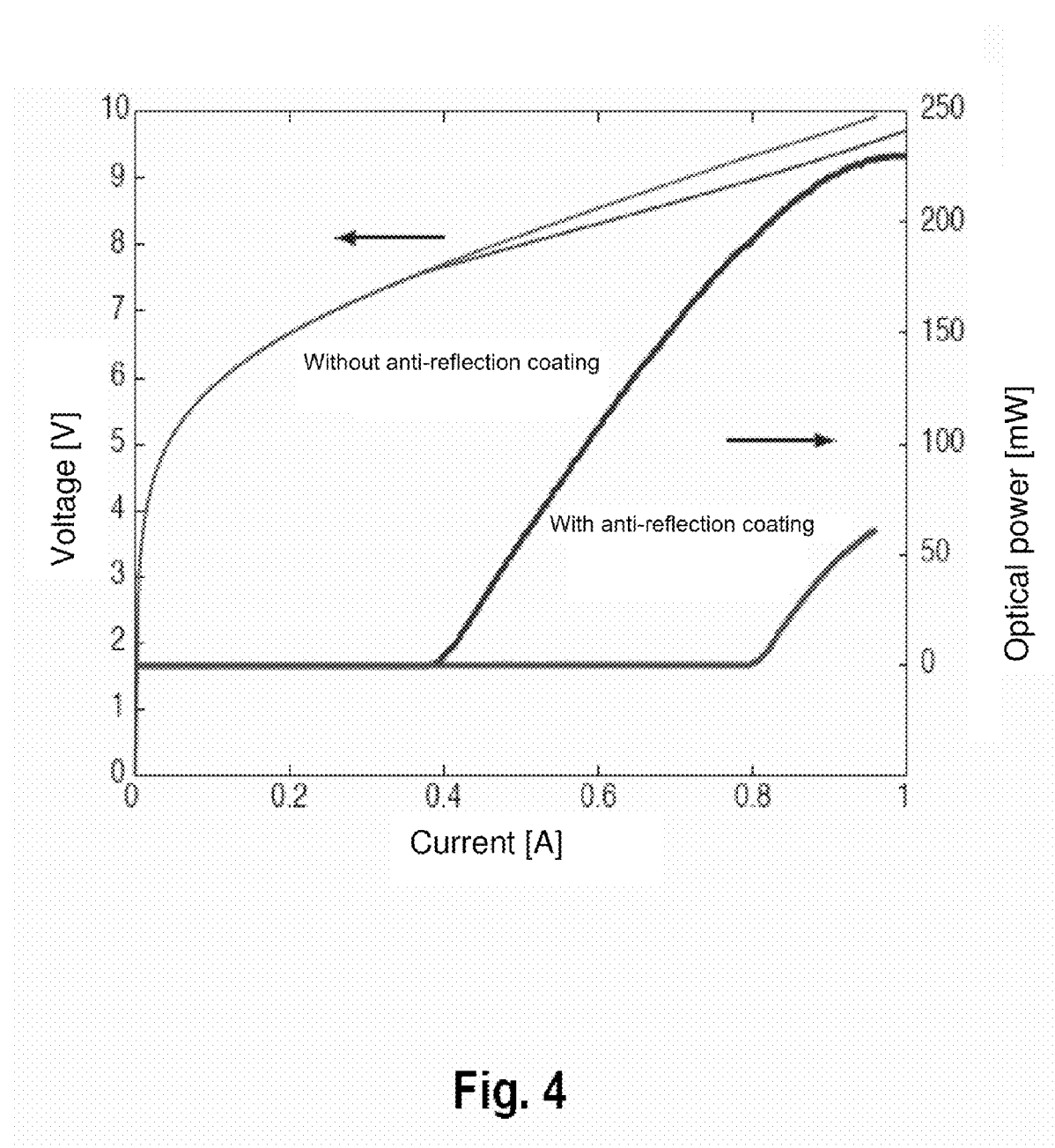
FIG. 4 is a graph showing the effect of the anti-reflection coating made according to the teachings of the invention on the performances of a laser amplifier showing that the reflectivity of the output face is quasi zero, which has the effect of strongly reducing laser amplification (increase the threshold current).

The thickness in nanometers of the first 36 and second 38 layers to be deposited on the output face 28 in order to obtain an anti-reflection coating 34 with zero reflectivity for different wave numbers in $cm^{-1}$, is indicated in the following "Table 2" corresponding to FIG. 3:

TABLE 2

| Wave number ($cm^{-1}$) | Thickness of the first $YF_3$ layer 36 (nm) | Thickness of the second ZnS layer 38 (nm) |
| --- | --- | --- |
| 1,000 | 607 | 507 |
| 1,100 | 564 | 453 |
| 1,200 | 527 | 408 |
| 1,300 | 496 | 370 |
| 1,400 | 470 | 338 |

TABLE 2-continued

| Wave number ($cm^{-1}$) | Thickness of the first $YF_3$ layer 36 (nm) | Thickness of the second ZnS layer 38 (nm) |
| --- | --- | --- |
| 1,500 | 446 | 310 |
| 1,600 | 426 | 286 |
| 1,700 | 407 | 265 |
| 1,800 | 390 | 247 |
| 1,900 | 374 | 231 |
| 2,000 | 359 | 217 |

According to still another non-illustrated alternative of the invention, other materials having analogous properties may be used for making the second layer 38 of the anti-reflection coating 34, for example $Nb_2O_5$, or $Si_3N_4$.

The layers 36, 38 of the anti-reflection coating 34 are deposited on the output face 28 of the laser amplifier 12 in a vacuum deposition chamber by thermal evaporation, by evaporation with an electron gun or by cathode sputtering for example. The thickness of each layer 36, 38 of the anti-reflection coating 34 is measured during the deposition by means of quartz scales.

With the laser amplifier 12 equipped with an anti-reflection coating 34 made according to the teachings of the invention, it is possible to obtain zero reflectivity for a widened range of laser radiation wavelengths comprised in the infrared, and more particularly in the mean infrared.

Further, the first layer 36 made in $YF_3$ is perfectly adherent to the output face 28 and there is no risk of it being detached from the output face 28 or of disintegration.

Also, the second layer 38 of the anti-reflection coating 34 is perfectly adherent to the first layer 36.

According to a non-illustrated alternative of the invention and by analogy with FIG. 1, the second layer 38 is interposed between the output face 28 and the first layer 38. Thus, the second layer 38 is laid out directly in contact with the output face 28 of the laser amplifier 12.

The materials used for making the second layer 38 are also perfectly adherent to the output face 28.

According to a non-illustrated alternative of the invention, the anti-reflection coating 38 includes more than two layers. At least one first layer is then made in yttrium fluoride while the second layers are made as described earlier.

The invention claimed is:

1. A quantum cascade laser amplifier which is capable of emitting infrared laser radiation, and which includes:
   a lower horizontal layer of a substrate in indium phosphide (InP);
   an active area which is formed by a vertical stack or horizontal layers of semiconducting materials grown epitaxially on the substrate;
   an anti-reflection vertical coating which covers a laser radiation output end vertical face and which has a refractive index ($n_D$) determined so as to let a totality of the laser radiation pass through the output face, the anti-reflection coating including:
   at least one layer having a first refractive index ($n_1$) smaller than the determined refractive index ($n_D$);
   and at least one second layer having a second refractive index ($n_2$) larger than the determined refractive index ($n_D$);
   wherein a first layer of the anti-reflection coating is made in yttrium fluoride ($YF_3$).

2. The laser amplifier of claim 1, wherein the first layer of the anti-reflection coating is interposed between the output face of the laser amplifier and the second layer.

3. The laser amplifier of claim 1, wherein the second layer is made in zinc selenide (ZnSe).

4. The laser amplifier of claim 1, wherein the second layer is made in zinc sulfide (ZnS).

5. The laser amplifier of claim 1, wherein the second layer is made in niobium oxide ($Nb_2O_5$).

6. The laser amplifier of claim 1, wherein the second layer is made in silicon nitride ($Si_3N_4$).

7. The laser amplifier of claim 1, emitting multimode laser radiation in the near and/or mean infrared, wherein their wavelengths are comprised between 3 and 18 μm.

8. The laser amplifier of claim 2, emitting multimode laser radiation in the near and/or mean infrared, wherein their wavelengths are comprised between 3 and 18 μm.

9. The laser amplifier of claim 1, wherein thicknesses of the first and second layers of the anti-reflection coating are determined according to wavelengths of the laser radiation.

10. The laser amplifier of claim 2, wherein thicknesses of the first and second layers of the anti-reflection coating are determined according to wavelengths of the laser radiation.

11. A quantum cascade laser amplifier, which is capable of emitting infrared laser radiation and which includes:
    a lower horizontal layer of a substrate in gallium arsenide (GaAs);
    an active area which is formed by a vertical stack of horizontal layers of semiconducting material grown epitaxially on the substrate;
    an anti-reflection vertical coating which covers a laser radiation output end vertical face and which has a refractive index ($n_D$) determined so as to let a totality of the laser radiation pass through the output face, the anti-reflection coating including:
        at least one first layer having a first refractive index ($n_1$) smaller than the determined refractive index ($n_D$);
        and at least one second layer having a second refractive index larger than the determined refractive index ($n_D$);
    wherein a first layer of the anti-reflection coating is made in yttrium fluoride ($YF_3$).

12. The laser amplifier of claim 11, wherein the first layer of the anti-reflection coating is interposed between the output face of the laser amplifier and the second layer.

13. The laser amplifier of claim 11, wherein the second layer is made in zinc selenide (ZnSe).

14. The laser amplifier of claim 11, wherein the second layer is made in zinc sulfide (ZnS).

15. The laser amplifier of claim 11, wherein the second layer is made in niobium oxide ($Nb_2O_5$).

16. The laser amplifier of claim 11, wherein the second layer is made in zinc silicon nitride ($Si_3N_4$).

17. The laser amplifier of claim 11 emitting multimode laser radiation in the near and/or mean infrared, wherein their wavelengths are comprised between 3 and 18 μm.

18. The laser amplifier of claim 11, wherein the thicknesses of the first and second layers of the anti-reflection coating are determined according to wavelengths of the laser radiation.

19. The laser amplifier of claim 12, wherein the thicknesses of the first and second layers of the anti-reflection coating are determined according to wavelengths of the laser radiation.

20. The laser amplifier of claim 1, wherein the determined refractive index ($n_D$) is an ideal refractive index.

21. The laser amplifier of claim 11, wherein the determined refractive index ($n_D$) is an ideal refractive index.

* * * * *